United States Patent [19]
Konicek et al.

[11] Patent Number: 5,160,567
[45] Date of Patent: Nov. 3, 1992

[54] SYSTEM AND METHOD FOR MANUFACTURING COPPER CLAD GLASS EPOXY LAMINATES

[75] Inventors: Jiri D. Konicek; Robert P. Smith; Jerry C. Zeroth, all of Onalaska, Wis.

[73] Assignee: Allied-Signal Inc., Morris Township, Morris County, N.J.

[21] Appl. No.: 685,337

[22] Filed: Apr. 15, 1991

[51] Int. Cl.$^5$ .............................................. B32B 31/00
[52] U.S. Cl. ............................ 156/288; 156/299; 156/556; 156/563; 156/580
[58] Field of Search ............... 156/563, 242, 288, 299, 156/556, 580, 629, 630; 162/13, 105, 106, 107, 138; 29/830

[56] References Cited

U.S. PATENT DOCUMENTS

| | | | |
|---|---|---|---|
| 2,186,954 | 1/1940 | Boughton et al. | 428/324 |
| 3,215,579 | 11/1965 | Hagen | 156/289 |
| 3,573,126 | 3/1971 | Kougel | 156/251 |
| 3,617,613 | 11/1971 | Benzinger | 156/299 X |
| 3,932,250 | 1/1976 | Sato et al. | 156/213 |
| 3,969,177 | 7/1976 | Doran et al. | 156/288 |
| 4,207,129 | 6/1980 | Tadewald | 156/242 |
| 4,249,977 | 2/1981 | Bartholomew | 156/288 |
| 4,505,771 | 3/1985 | George | 156/563 X |
| 4,550,239 | 10/1985 | Uehara et al. | 219/121.43 |
| 4,558,983 | 12/1985 | Freeman et al. | 414/331 |
| 4,579,612 | 4/1986 | Held | 156/64 |
| 4,599,127 | 7/1986 | Cannady, Jr. et al. | 156/289 |
| 4,643,629 | 2/1987 | Takahashi et al. | 414/331 |
| 4,652,324 | 3/1987 | Yamashina et al. | 156/242 |
| 4,712,963 | 12/1987 | Kondo | 414/222 |
| 4,725,182 | 2/1988 | Sakamoto et al. | 414/331 |
| 4,806,059 | 2/1989 | Gossl et al. | 414/331 |
| 4,808,057 | 2/1989 | Chiappe et al. | 414/267 |
| 4,824,310 | 4/1989 | Kosmowski et al. | 414/222 |
| 4,831,718 | 5/1989 | Zumstein et al. | 29/609 |
| 4,848,537 | 7/1989 | Richards et al. | 198/778 |
| 4,871,290 | 10/1989 | Kaczynski et al. | 414/331 |
| 4,875,283 | 10/1989 | Johnston | 29/830 |
| 4,911,771 | 3/1990 | Tanaka et al. | 156/60 |
| 4,923,054 | 5/1990 | Ohtani et al. | 187/25 |
| 4,932,828 | 6/1990 | Katae et al. | 414/286 |

Primary Examiner—David A. Simmons
Assistant Examiner—J. Sells
Attorney, Agent, or Firm—Jay P. Friedenson

[57] ABSTRACT

A system of conveyors and handlers for manufacturing copper clad laminates is disclosed. The system has a layup station including at least two clean rooms in which B-stage and copper foil sheets are respectively placed. A sandwich comprising a copper foil sheet placed into contact with a press plate is conveyed from the first to the second clean room where a B-stage sheet is positioned against the copper foil. The resulting uncured laminate is then transferred with its press plate to a stacking station until a predetermined number of laminates, separated by press plates, is stacked into a "book". One or more books are then conveyed through press loading equipment where heat and pressure are applied to cure the laminates. The books are then transferred to a breakdown station where the cured laminates and press plates are successively and sequentially stripped from the book. The press plates are conveyed back to the layup station for recycling into "new" books with each press plate cleaned immediately prior to reentering the first clean room. To minimize the migration of B-stage dust or fibers from the second to the first clean room, the ambient atmospheric air pressure within the first clean room is maintained at a greater pressure than the air pressure within the second clean room.

25 Claims, 8 Drawing Sheets

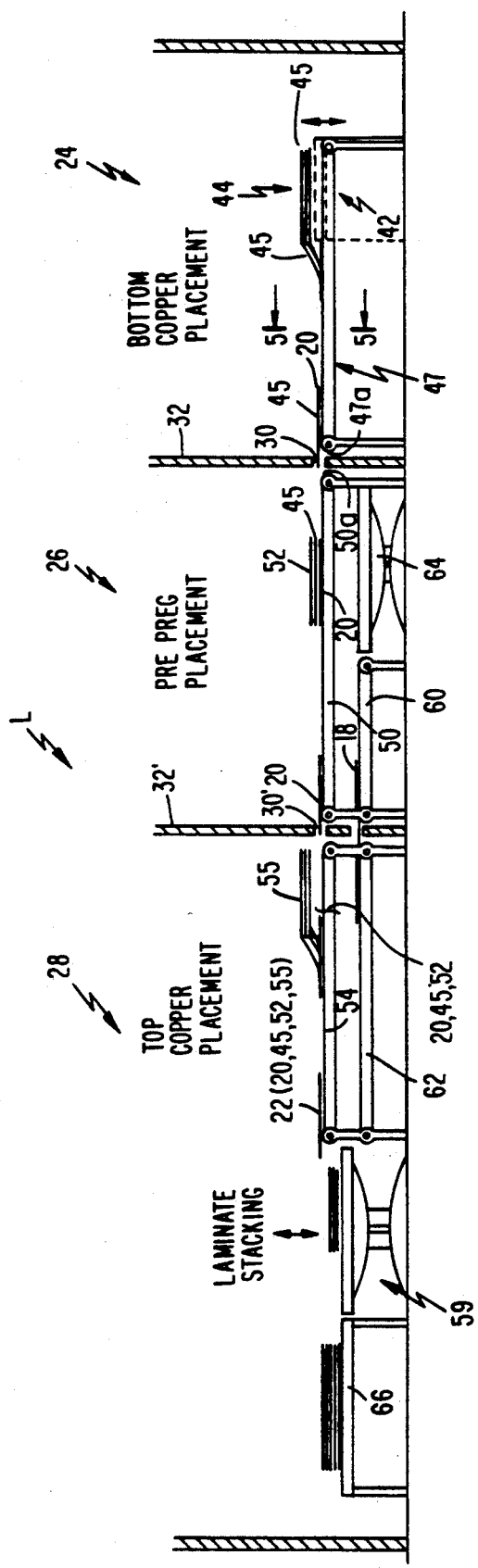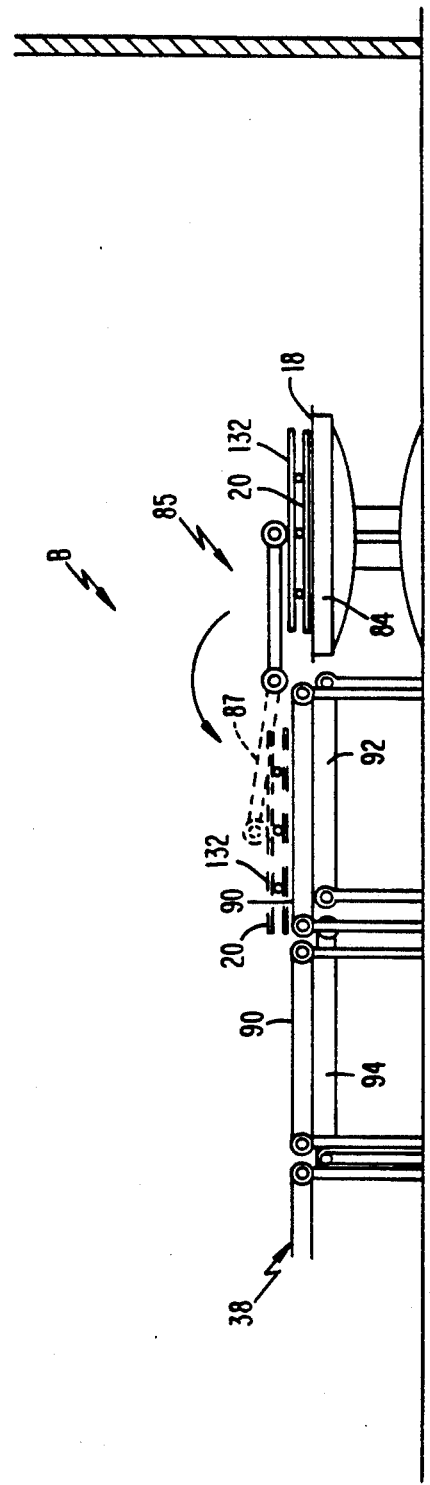

SYSTEM AND METHOD FOR MANUFACTURING COPPER CLAD GLASS EPOXY LAMINATES

TECHNICAL FIELD

The present invention relates generally to manufacturing of flat laminate members and, more particularly, to the manufacturing of a copper clad laminate in the form of flat stock material used to fabricate printed circuit boards.

BACKGROUND ART

A printed circuit board laminate generally comprises several sheets of epoxy impregnated fiberglass cloth, called "pre-preg", sandwiched on each side by a sheet of copper foil. A process for manufacturing a copper clad laminate, as generally known in the art, commences with coating a web of glass cloth with a solution of epoxy resin to form a B-stage. The B-stage is sheeted to a suitable size, and a predetermined number of sheets are piled up to achieve a predetermined thickness of the final pre-preg laminate. Copper foil of suitable sheet size is then placed on each side of the B-stage pre-preg. The copper B-stage pre-preg copper laminate assembly is then placed between a pair of stainless steel press plates and inserted into a known vacuum hot press for pressing of the laminate. In the hot press, the assembly is heated up which causes the epoxy resin in the B-stage to melt and harden, forming the insulating core of the laminate. Subsequently, the laminate is cooled and removed with the press plates from the hot press. The laminate is then separated from the press plates which results in a final product while the press plates are reused for the next cycle of manufacturing laminates.

The intended use of the laminates requires etching of conductive lines so as to effect electrical connections on the laminate surface. These lines are typically outlined and etched with photochemical means and may be as narrow as 0.002–0.005 inches. Consequently, any small surface defect on the copper surface may interface with the formation of these circuit lines and is therefore undesirable.

In known large scale laminate manufacturing plants, a multiple assembly of press plates, copper foils and B-stage pre-pregs have to be prepared for insertion into the press. The multiple assembly, known in the industry as a "book", may be typically contain eight to twelve laminates. In order, a "book" may comprise a carrier plate on which is stacked, in order, press pads, approximately twelve press plates each containing one laminate, one additional press plate, and press pads. The "carrier plate" is generally a hardened steel plate which carries the book of laminates from the laminate assembly point to the press area, then through breakdown of the book after pressing. The carrier plate is used to absorb the abuse caused during the material handling of the book. The thickness of the carrier plate is generally about 0.118 inches. The length and width of the carrier plate is approximately six inches larger in each direction than the largest press plate. In addition, T handles or tangs may be attached to each transverse end of the carrier for pulling the books on and off loading and unloading elevators.

Each press plate is generally a stainless steel plate on which the laminate is assembled. The press plate length and width is generally the same as the pre-preg length and width. The copper foil length and width dimensions are generally one inch larger in each direction than the press plate.

A great deal of effort has been expended to create layup systems which would assure a minimized contamination of the copper foil and stainless steel plate surfaces to obtain non-contaminated laminate surfaces. In one known laminate layup system, the book of laminates is started by placing the first stainless steel press plate onto a carrier plate/press pad base. The first or bottom copper foil is placed on the press plate, followed B-stage and the second or top copper foil. Then the process of placing the next press plate, bottom copper foil, B-stage, and top copper foil is repeated until the desired number of assemblies for the book is attained. The book is then removed for pressing and assembly of a new book starts.

The process of building the book is typically performed in a "clean room", i.e., air entering the room is filtered. A clean room is preferred to minimize entry of particulate contaminants. Accordingly, the press plates are cleaned by mechanical means to minimize such contaminants. The largest problem for achieving defect-free surfaces comes from handling B-stage material in conjunction with the copper foil and stainless steel plates. This is because the B-stage contains very brittle epoxy resin and the resin particles and residues of glass fibers from pre-preg cutting and sheet surface abrasion is highly static and numerous. When handled in one room with clean surfaces of press plates and copper foils, either manually or with overhead handlers, some of these particles inevitably contact onto the critical surfaces and create surface defects. Such defects often require the laminate to be scrapped since various criteria for determining surface defects are stringent. For example, a dent of 0.015 inches in diameter appearing in the outer skin of the copper foil (top or bottom) would disqualify a laminate sheet as per military specification MIL-P-13949-G. Much more stringent requirements are also in place within the industry.

In a known modification to the standard layup system described above, a book of laminates reciprocates between two rooms. In one room, press plates and copper foils are handled and, in the second room, pre-preg is placed onto the copper foil underneath. This system tends to improve avoidance of contamination somewhat. However, the exposed surface of the B-stage has to enter the "metal" clean room and decelerate to a stop which creates slight air turbulence with further turbulence created when placing the top copper foil onto the exposed pre-preg. In addition, the movement of the buildup from room to room is slow and the large surface of the book and carriage tends to carry particulate contamination from room to room.

In a prior layup operation, used by the assignee of the present invention, the copper foils, B-stage pre-preg, press plates and carrier trays or plates are all located in the same room where the component assembly or layup is performed. Generally, a layup station has a central work surface such as a lift table or conveyor table that serves as the assembly point for the laminate components. Prior to commencement of the layup operation, a carrier plate is placed into position on the layup station's central work surface. Depending on the operation, the carrier plate may be placed manually or with automated conveyor equipment. The foils, B-stage and clean press plates are located around the work station so that they may be placed onto the carrier tray at appropriate intervals. With a fully manual system, stacks of properly sized foil, B-stage, and clean press plates are arranged around the carrier tray station so that minimum operator movement is required during the layup operation. When a greater degree of automation is used, foil and press plates are not stored around the layup station in stacks but are brought in a continuous manner with overhead equipment as needed. Typically, however, the B-stage pre-preg is stacked near the central layup table.

Prior to starting the layup operation, several sheets of kraft paper are placed on the carrier plate. The kraft paper serves as a thermal lag material and also improves pressure distribution characteristics during lamination.

After the carrier tray and kraft paper are in position, the layup process can begin. The sequence of operations, whether performed manually or by automated equipment, is as follows:

1. A clean, polished press plate is placed onto the kraft paper that is located on the carrier tray.
2. A sheet of copper foil is placed onto the press plate, with the shiny side facing down, and the adhesion enhancement side facing up.
3. B-stage, one sheet or many, is placed onto the copper foil. Care is taken to ensure alignment.
4. A sheet of copper is placed onto the B-stage, with the shiny side facing up, and the adhesion enhancement side facing toward the B-stage.
5. Another press plate is placed on top of the foil.

Steps two through five are repeated until eight to twelve laminates have been stacked on top of the carrier tray. Sheets of kraft paper are placed on top of the last press plate. This then completes a "book", which is transported to a load elevator to await pressing, or lowered on a lift table to allow another carrier tray to be placed on top of it (most manual systems lay up an entire press load, 10-20 books, on a single lift table, and then transport the entire load to the press).

In an alternative layup operation, the copper foil, B-stage, press plates, and carrier plates used in the shuttle layup system are not located in the same room as in the above-mentioned standard layup operation. Instead, the copper foil and press plates are located in one room while the B-stage is placed in an adjacent room. Stacks of properly sized foil, clean press plates, and B-stages are placed ergonomically in their respective rooms prior to commencement of the layup operation. A track or conveyor extends from the copper/plate room into the B-stage room through an opening in a common wall. The height of the conveyor or track is about three feet and is sized so that a carrier plate can be transferred back and forth (i.e. shuttled) between the two rooms.

Prior to starting the layup process, the carrier plate is placed onto the shuttle conveyor in the copper/plate room. Kraft paper is placed onto the carrier plate to aid in pressure distribution and heat transfer adjustment, as aforesaid. After the carrier plate and kraft paper are in position, the layup process is as follow:

1. A clean, polished press plate is placed onto the kraft paper that is located on the carrier tray.
2. A sheet of copper foil is placed onto the press plate, with the shiny side facing down, and the adhesion enhancement side facing up.
3. The carrier tray is shuttled through the opening in the wall into the B-stage room.
4. B-stage, one sheet or many, is placed onto the copper foil. Care is taken to ensure proper alignment.
5. The carrier tray is shuttled back into the copper/plate room (with previously placed components).
6. A sheet of copper foil is placed onto the B-stage, with the shiny side facing up, and the adhesion enhancement side facing down.
7. Another press plate is placed on top of the foil.

Steps two through seven are repeated until the book is completed. Kraft paper is placed on the last press plate, and the book is taken to a load rack or elevator to await lamination under heat and pressure.

With the foregoing shuttle system, in comparison with the standard system, there is provided better separation of the B-stage from the copper foil and press plate, theoretically reducing the probability of contaminating the plates and copper surfaces with B-stage dust particles. However, the transfer of the carrier tray through the wall connecting the two rooms does allow a certain amount of B-stage contamination to occur. Also, the above-described shuttle layup operation is about 30% slower than the aforementioned standard layup operation.

It is accordingly one objection of the present invention to minimize, during layup, particulate contamination of copper foils and press plate surfaces from resin particles and glass fiber residues.

Another object of the invention is to minimize the aforesaid particulate contamination of copper foils and press plate surfaces in a high speed continuous production process for the layup of one or more laminate books and the breakdown of such books, after curing, in an automated conveyorized system.

Another object is to positively control the flow of air within the layup stations to prevent airborne resin and glass fiber particles from traveling to the copper foil/press plate rooms from a pre-preg layup room.

Still another object is to achieve layup and breakdown of laminate books and minimize contamination of copper foil and press plate surfaces through the avoidance of overhead handling equipment and by means of minimal contact between conveyorized equipment and clean surfaces of the press plates during their conveyance in the layup process.

DISCLOSURE OF THE INVENTION

A system is disclosed for manufacturing a copper clad laminate having a B-stage substrate sheet which is an epoxy coated web of glass cloth with at least one first sheet of copper foil respectively adhered to at least one side of the B-stage. The system comprises a layup station including at least two clean rooms communicating with each other through an opening provided in an adjoining common wall area. The first clean room is adapted to contain copper foil and successively receive a plurality of press plates. The second clean room is adapted to contain the B-stage sheets. The first clean room has a first layup station on which is received one press plate with a sheeted layer of copper foil on at least one surface of the press plate. The resulting sandwich including the press plate and sheeted copper foil layer is conveyed from the first clean room, through the opening, into the second clean room having a second layup region on which a sheet of B-stage is placed into contact with the sandwich against the copper foil side thereof. A stacking station, downstream from the second clean room, sequentially receives the sandwiches to form a stacked book of sandwiched laminates separated from each other with a press plate. The book includes, and rests upon, a carrier plate delivered to the stacking station and on which the sandwiches are successively stacked. The at least one book is conveyed from the stacking station to a pressing station wherein heat and pressure is applied to the book to melt and then harden the B-stage laminates to adhere the copper foils to their associated B-stage. The at least one cured book is delivered from the pressing station to a breakdown station which includes a breakdown press plate handler movable between pickup and deposit positions for engaging an uppermost exposed press plate within the book and transferring it to the deposit position. At the deposit position, a press plate conveyor receives the transferred press plates and conveys the same to the first clean room for recycling in the buildup of a subsequent book. A buffer is positioned within the press plate conveyor means for cleaning the press plate before it is conveyed to the first clean room. Following removal of all the press plates from the book, a carrier plate conveyor arrangement conveys the now exposed carrier plate to the stacking station for recycling.

In accordance with a preferred feature of the invention, the relative ambient atmospheric air pressures within the first and second clean rooms are controlled to create an over-pressure preventing the migration of B-stage dust or fibers from the second to the first clean room through the opening. The atmospheric air pressure within the first clean room is therefore preferably greater than the atmospheric air pressure within the second clean room.

In a preferred embodiment of the present invention, a third clean room is provided downstream from the second clean room to contain additional copper foil. Means is provided for positioning copper foil in the first clean room onto a press plate to enable B-stage to be deposited on the copper foil in the second clean room. Further positioning means is provided to position the additional copper foil on the B-stage in the third class clean room. Preferably, the ambient atmospheric pressure in each of the first and third clean rooms is greater than the ambient pressure within the second clean room containing a B-stage to prevent migration of B-stage dust and fibers into either of these copper containing rooms.

In accordance with another preferred feature of this invention, separate conveyors are provided in each of the clean rooms to avoid transfer of B-stage dust or fibers, via the conveyors, into the first and/or third clean rooms. Preferably, the conveyors have minimal contact with the overlying press plate and therefore include a pair of thin belts positioned to contact and support only the longitudinally extending edges of the press plate and, optionally, a thin center belt adapted to contact the plate approximately along its central longitudinal axis. The center belt is preferably cleaned after about each revolution.

The B-stage and copper foils are preferably handled and moved within the clean rooms without the use of overhead handling equipment.

In accordance with a second embodiment of the present invention, copper foil is disposed on the layup table in the first clean room and a press plate is positioned on the copper foil. Additional copper foil is placed on the press plate to form a metal sandwich. A clamping arrangement clamps the copper foils and press plate together via clamping contact with the longitudinally extending edges of the metal sandwich. The clamped metal sandwich is then conveyed into the second clean room and a sheet of B-stage is disposed against the surface of the top facing copper foil.

The layup table preferably includes an air table adapted to receive the bottom cover foil. The air table includes plural air passageways substantially uniformly distributed throughout its table surface. Pressurized air is supplied through the passageways to establish an air cushion between the table and the air table is used to maintain contact between bottom copper and press plate, not to prevent contamination.

The clamping arrangement preferably includes a pair of longitudinally extending stationary glide rails mounted adjacent the slides of the air table. A roller arrangement engages the respective glide rail in rolling contact for supporting the clamp for movement in the direction of conveyance of the metal sandwich. Each clamp is movable between an unclamped position and a clamping position in clamping contact only with the longitudinally extending edges of the sandwich extending laterally outward from the table.

The breakdown station preferably includes a book breakdown turntable rotatable through 90° between first and second angular orientations. A book transfer conveyor transfers the cured book from the pressing station to the breakdown turntable in the first orientation. The turntable then rotates into the second orientation to thereby locate the book in the pickup position of the breakdown press plate handler whereupon the press plates are sequentially removed from the book for discharge to the press plate conveyor. Following completion of press plate removal, the breakdown turntable, which is elevationally coextensive with the upstream end of the carrier plate conveyor, discharges the carrier plate to complete the disassembly of the cured book.

The carrier plate is discharged directly onto an upstream end of the carrier plate conveyor arrangement which is located below the press plate conveyor. The carrier plate conveyor arrangement preferably includes a carrier plate indexing conveyor which receives the carrier plate from the upstream, lowers, and indexes the plate 90° while maintaining the same plate angular orientation for travel in a direction of conveyance perpendicular to the direction of the press plate conveyor. The carrier plate is conveyed to a second carrier plate indexing conveyor positioned downstream from the first indexing conveyor. The second indexing conveyor lowers, indexes the plate 90° to convey the plate to a carrier plate turntable which is disposed beneath the layup line. This carrier plate conveyor conveys the carrier plate to a stacking turntable in the layup line which is adapted to receive the press plates with laminates in stacking arrangement to form a new book.

Still other objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF DRAWINGS

FIG. 2 is a schematic elevational view of the arrangement of FIG. 1 taken along the line 2—2 of FIG. 1 to depict the top and bottom copper and pre-preg layup rooms in accordance with the first preferred embodiment;

FIG. 3 is a schematic elevational view taken along the line 3—3 of FIG. 1 to depict the breakdown of a cured book;

BEST MODE FOR CARRYING OUT THE INVENTION

Figure 1:
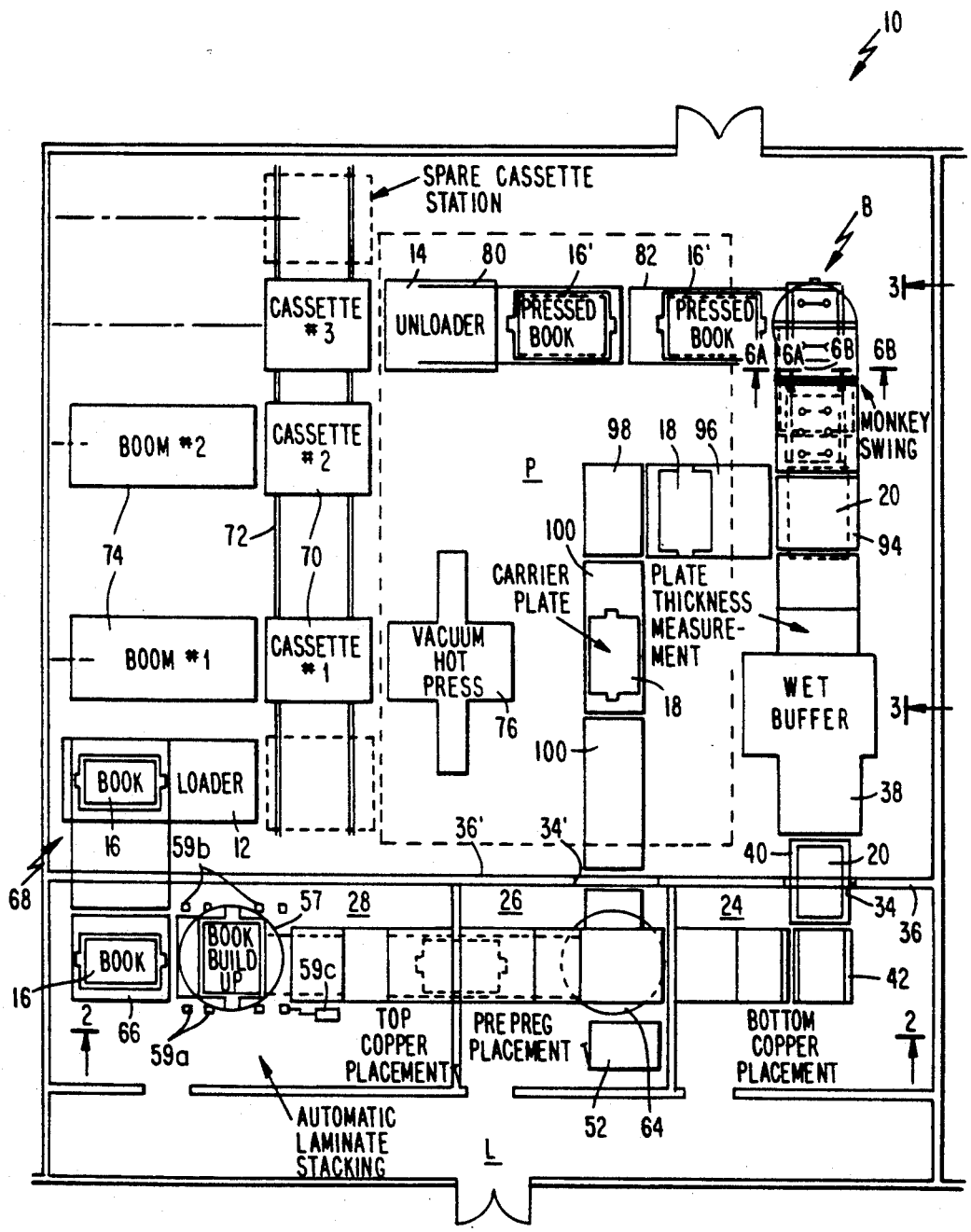
FIG. 1 is a schematic plan view of a system for manufacturing copper clad laminates in accordance with a preferred embodiment of the present invention.
Figure 4:
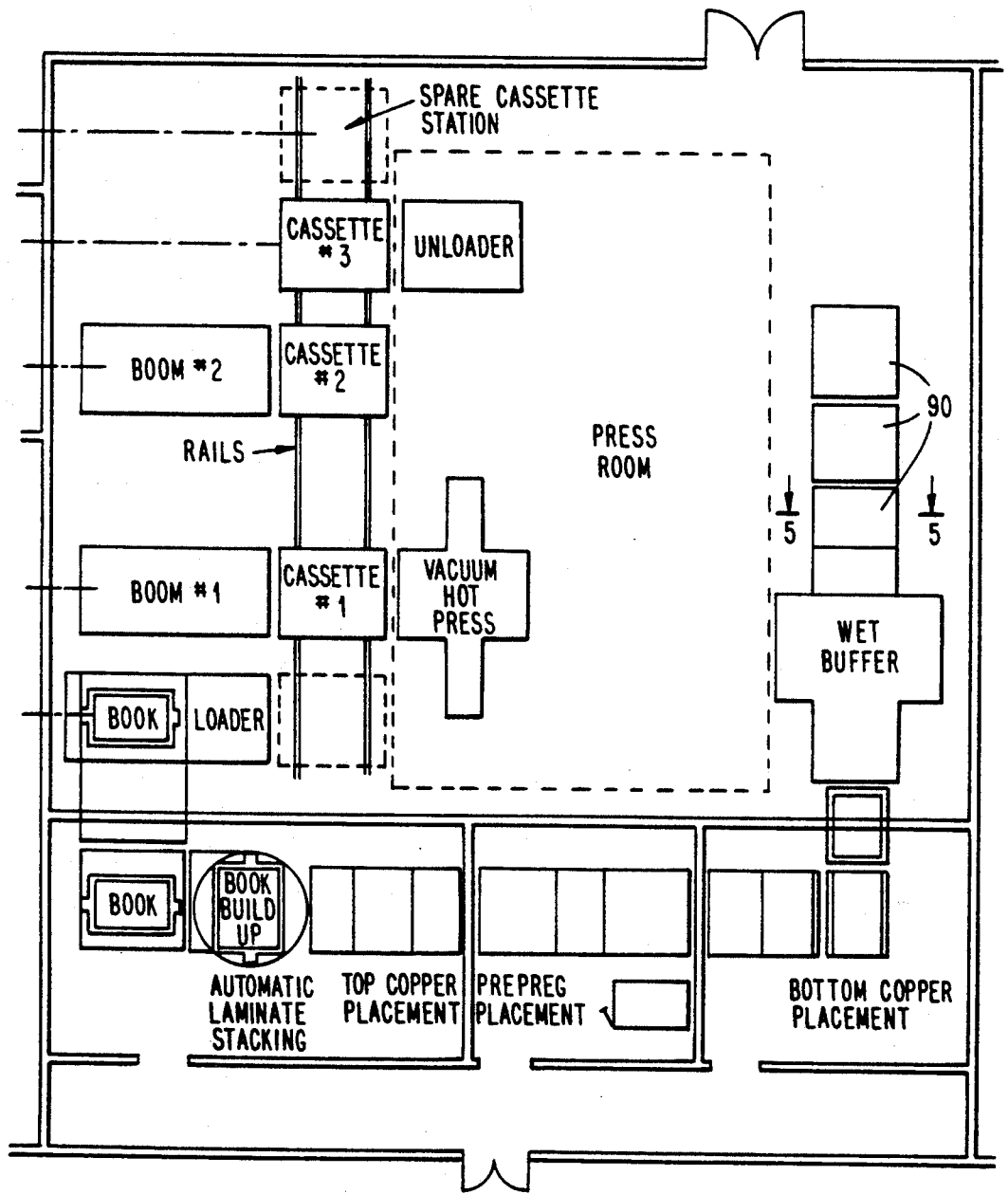
FIG. 4 is a schematic plan view of the system of FIG. 1 to further depict the press plate assembly.

FIG. 1 is a schematic plan view of a layup/breakdown system 10 of conveyors and handlers arranged to operate in conjunction with press loading and unloading equipment generally identified by reference numerals 12 and 14, respectively. The system 10 has a layup station L in which books 16 of partially cured laminates are formed and conveyed to a press room P where heat and pressure are applied to each book 16 to fully cure the laminates. The "pressed" books 16' of laminates are then conveyed through a series of conveyors and handlers at a breakdown station B where the books 16' are disassembled with the carrier plates 18 and press plates 20 returned to the layup station L for recycling in the assembly of new books 16 in a continuous process of breakdown and buildup. As used herein, the following terms are intended to have the definitions noted below:

LAMINATE: A laminate consists of several sheets of epoxy impregnated fiberglass cloth called pre-preg sandwiched on each side by a sheet of copper foil. The unpressed thickness range for a sheet of pre-preg will be 3 mils to 10 mils and for copper foil will be 0.7 mils to 2.8 mils. The unpressed thickness of the laminate will range between 3 and 110 mils.

PRESS PLATE: A stainless steel plate (420 S,S., 44-48 Rc) on which the laminate is assembled. The press plate length and width may be the same as the pre-preg length and width. The copper foil length and width dimensions may be one inch larger in each direction than the pre-preg.

BOOK: A book consists of a carrier plate on which is stacked (in this order) press pads, approximately twelve press plates each containing one laminate, one additional press plate, and press pads. The book is loaded into one opening of a multi-opening press where the book of laminates is cured using elevated temperatures and pressures. The weight of a book may be approximately 1,000 pounds, but varies widely depending upon sheet size, laminates per tray, and plate thickness.

CARRIER PLATE: Hardened steel plate (e.g., 42 CR Mo.4, 40–42 Rc) which carries the book of laminates from the laminate assembly point to the press area, then through breakdown of the book after pressing. This carrier plate is used to absorb the abuse caused by the material handling of the book. Thickness of the plate is 0.118 inches. The length and width of the plate is approximately six inches larger in each direction than the largest press plate. In addition, tee handles are attached to each end of the carrier for pulling the books on to the unloading elevator.

LAY-UP: Process in which the book is assembled. The cleanliness of this process is paramount to producing a quality product. The layup is done in a clean room environment.

PRESS PADS: Material, usually a type of paper, used to absorb the thermal shock during the pressing process.

BREAKDOWN: Process in which the books are disassembled after the pressing operation. The laminate is removed manually as a plate transfer unit removes the plates.

PLATE CLEANER: Machine utilizing abrasive brushes to clean the press plates after breakdown in preparation for the next layup.

OPERATING SEQUENCE

In accordance with a first embodiment of the present invention, referring to FIGS. 1-3, each laminate 22 is built in three clean rooms, a bottom copper placement room 24, a B-stage placement room 26, and a top copper/stacking room 28. Narrow slots 30 are provided in the common walls 32 of adjacent clean rooms 24,26,28 to permit transfer of the press plate 20 to each clean room.

Layup commences as a press plate 20 enters the bottom copper cleaning room 24 through an inlet opening 34 in one wall 36 thereof after exiting the press plate cleaning machine 38. The press plate 20 enters the clean room 24 on a conveyor 40 and is deposited onto an indexing conveyor 42 (at an upper elevational location coextensive with conveyor 40) located at the upstreammost end of the layup line L. The indexing conveyor 42 then lowers and indexes the press plate 20 through 90° while maintaining the same angular orientation. A stack 44 of sheeted bottom copper foil located above the indexing conveyor 42 allows the placement (either manually or by machine) of a sheet 45 of bottom copper onto the press plate 20 as the plate moves along a press plate conveyor unit 47. The press plate/bottom copper 20,45 is then conveyed by press plate conveyor unit 47 (elevationally coextensive with the indexing conveyor in its lower elevational location) towards second clean room 26 as discussed infra. Once the press plate 20 is discharged from the lowered positioned of the indexing conveyor 42 onto the press plate conveyor 47, the indexing conveyor raises to await the next press plate 20.

The press plate conveyor 47 conveys the press plate/bottom copper foil 20,45 from the first clean room 24 to second clean room 26 through elongate opening 30 in a common wall 32 therebetween. The elongate transverse opening 30 is aligned with the conveyor flow path and is of sufficient dimension to enable passage of the press plate/bottom copper foil 20,45 therethrough to prevent unnecessary air flow between the adjoining clean rooms 24,26. The press plate/bottom copper foil 20,45 is transferred to a second press plate conveyor 50 disposed in the second clean room 26 and aligned and elevationally coextensive with the first press plate conveyor 47 in the first clean room 24. The downstream and upstream ends 47a,50a of the first and second press plates conveyors 47,50, as depicted in FIG. 2, are disposed immediately adjacent the opening 30 within their respective clean rooms 24,26. By providing separate press plate conveyors 47,50 within the respective clean rooms, transfer of contaminants from one room to another via the conveyor belts is advantageously avoided.

In the second clean room 26, a sheet of pre-preg 52 is placed (manually or by machine) on the exposed upper surface of the bottom copper foil 45. To minimize contamination, pre-preg placement is the only operation that occurs in the second clean room 26. Thereafter, the press plate/bottom copper foil/pre-preg sandwich (20,45,52) is conveyed from the second clean room 26 to the third clean room 28 through an opening 30' provided in the adjoining common wall 32' therebetween. Immediately upon entering the third clean room 28 from the second clean room 26 through the opening 30', the leading end of the press plate/bottom copper/pre-preg sandwich (20,45,52) engages the upstream end of a third press plate conveyor 54 extending transversely and parallel to the opening 30'. In the third clean room 28, a sheet of top copper foil 55 is placed on the sandwich, either manually or by machine, to completely cover the exposed upper surface of the pre-preg 52. The top copper foil sheets 55 are disposed in a stack situated above the press plate conveyor 54 proximate the entrance opening.

As mentioned above, the laminate (45,52,55) comprising the top and bottom copper foils as well as the pre-preg may be manually laid upon top of the press plate 20. Following layup of the top copper foil on the pre-preg, the press plate, with the laminate thereon, is conveyed by the third press plate conveyor 54 to an automatic laminate stacking station 57 as depicted in FIGS. 1 and 2 where it is placed on top of a previous press plate/laminate package. With reference to FIG. 2, the automatic laminate stacker includes a stacking turntable 59 incrementally movable between upper and lower positions. In the lower position, depicted in FIG. 2, the turntable 59 initially receives a carrier plate 18 transferred to it via carrier plate conveyors 60 and 62 respectively located vertically below the press plate conveyors 50,54. After carrier plate 18 is initially deposited onto the stacker 59 at the lower elevational position, the stacker rotates 90° and is then raised to a position slightly lower (e.g., one inch) than the elevation of the press plate conveyor 54 to accommodate sag in the middle of the laminate sandwich as it leaves conveyor 54. The sag occurs since the mechanism (not shown) which carries the laminate sandwich over the top of the stacker only holds the press plate by the edges parallel to the press plate conveyor with no center support, i.e., the center of the plate deflects. As the laminates are stacked on top of each other, the turntable adjusts to a slightly lower position to make up for book thickness until the book 16 is built up to contain a required number of press plate/laminate packages.

To facilitate transfer of the press plate/laminate sandwich from conveyor 54 to the scissor lift or stacker turntable 59, there is provided a pair of pin stacker transfer mechanisms extending along opposite sides of the stacker to a point proximate the downstream end of the conveyor 54. As schematically depicted in FIG. 1, each mechanism includes a series of pins 59a,59b, respectively, mounted in bearings for rotation along horizontal axes. The pins 59a,59b may be approximately 0.375 inches in diameter and are located on four-inch centers parallel to press plate conveyor 54. The mechanisms are located on each side of and above the scissor lift and are independent of the scissor lift. The pins 59a,59b protrude inward toward the center of the scissor lift a distance which only allows the pins to respectively carry the press plate coming off of conveyor 54 by the edges of the press plate parallel to conveyor 54. The pins touch the underside of the press plate preferably no more than ⅜ of an inch into the plate from the plate edge (i.e., the non-working area of the press plate). The pins 59a,59b are driven by synchronized boaters schematically depicted as 59c so that the surface speed of the rotating pins matches that of press plate conveyor 54. In addition, the rotating driven pin mechanisms on each side of the scissor lift 57 are capable of indexing movement in a direction transverse to the longitudinal direction of conveyance by an indexing distance of approximately one inch to attain the following sequence of operation. Initially, as mentioned above, the scissor lift or stacker 59 is located below the pin stacker mechanisms 59a,59b and is adjusted to a position slightly lower than the elevation of press plate conveyor 54 as aforesaid. As the press plate with the laminate sandwich exits from conveyor 54, the underside longitudinal edges of the press plate/laminate is engaged by the lead ones of pins 59a,59b and driven over the top of the scissor lift 59 by successive engagement with the downstream driven pin mechanisms 59a,59b located above and on each side of the scissor lift. The pin mechanisms 59a,59b which carry the laminate sandwich and press plate over the top of the scissor lift 59 only holds the press plate by the longitudinal edges parallel to the press plate conveyor with no center support. Therefore, the plate defects or sags at the center which is the reason why the scissor lift adjusts to a position slightly lower than the press plate conveyor rather than at the same elevation, as aforesaid. The laminate sandwich is conveyored over the top of and in registration with the scissor lift by the driven pin mechanism 59a,59b. The driven pins 59a,59b then cease rotation so that the laminate sandwich stops at a predetermined position over the scissor lift. The scissor lift then adjusts automatically upward until the center of the deflected pres plate laminate sandwich touches the laminate previously stacked on the scissor lift. The driven pin mechanisms on each side of the scissor lift then index outward away from the center of the scissor lift and by approximately one inch to thereby release the longitudinal edges of the press plate laminate package to deposit and stack it on top of the previous laminate package.

Details of the stacking pin mechanism will now be obvious to one of ordinary skill in the art based upon a review of the structure and aforesaid operation thereof.

With reference to FIG. 1, and as will be discussed more fully below, the carrier plates 18 are sequentially conveyed into second clean room 26 from breakdown station B along a series of carrier plate conveyors and through an opening 34' in wall 36' to be deposited on a turntable 64 elevationally coextensive and upstream from carrier plate conveyor 60. The carrier plate 18 is rotated 90° on the turntable 64 before being deposited onto carrier plate conveyor 60 so that the lengthwise edges of the carrier plate are parallel to the direction of conveyance for ease of transfer to the stacking turntable 59 beneath the press plate conveyors 50,54. After being deposited onto stacker 59, the stacker again rotates the carrier plate through 90° so that it assumes the same orientation as the press plate/laminate packages.

Thereupon, the book 16 is transferred to a book indexing conveyor 66 which receives the book from the stacker 59, lowers, indexes the book 90° and discharges it onto an elevator delivery conveyor 68 (FIG. 1) while maintaining the same plate orientation. The elevator delivery conveyor 68, which extends across the loading elevator platform, delivers the book onto the elevator/loader 12. The elevator/loader 12 rises and lifts the book off the elevator delivery conveyor to load same into movable cassettes 70 with the loader. These cassettes 70 move along rails 72 and are transferred via booms 74 into a vacuum hot press 76 within the press room P and then a cage unloading elevator 14 having a puller device adapted to engage the plate tang of the carrier plate to pull the curved book 16' onto an elevator discharge conveyor 80.

The vacuum hot press 76, cassettes 70, booms 74, loader 12 and unloader 14 are conventional equipment known in the art. A vacuum hot press 76 such as may be used in the present invention comprises 21 heated plates, called platens, spaced apart vertically by approximately six inches. This yields 20 opening between the plates. The number of plates and spacing varies with different presses. Each plate is heated using high pressure hot water, steam, electric, or oil and the like. Around the platens is a structural box with doors which, with the doors closed, can be evacuated. The books 16 of laminates are inserted into the spaces (openings) between the platens. The doors are then closed and the press evacuated. Below the bottom platen is large ram inside of a hydraulic cylinder. Hydraulic pressure is applied to the underside of the cylinder to raise the ram which then raises the bottom platen with the book on top of it. As it is being raised, the bottom platen with the book contacts the second platen with the book, and pushes it up to contact the next platen until all 21 platens are squeezed together with the laminate books between them. Under tightly controlled temperatures and pressures, the books 16 are heated up and the epoxy resin in the B-stage melts and hardens. The books 16' are cooled in this press or automatically transferred to another press for cooling. A representative vacuum hot press 76 that may be used in the present invention is manufactured by Technical Machine Products, 5500 Walworth Ave., Cleveland, Ohio under Model No. 20204/Hot Press.

The cassettes 70 are devices used for staging and transferring of a press load of books. Each cassette 70 comprises the same number of tiers as there are openings in the presses 76 or 78. When the cassettes 70, which travel on rails 72 between designated points, are respectively stationed in front of a press 76 or 78, the complete set of books can be slid horizontally across into and out of the press at one time in a known manner. A representative cassette structure 70 is available from Technical Machine Products, 5500 Walworth Ave., Cleveland, Ohio under Model No. 20204/Cassette.

The booms 74 are mechanisms which transfer a complete press load of books simultaneously from one of presses 76 or 78 into the associated, aligned cassette 70. Such a boom 74 as used in the present invention is available from Technical Machine Products, 5500 Walworth Ave., Cleveland, Ohio under Model No. 20204/Boom.

The loader 12 is essentially an elevator conveyor which accepts one book at a time from the elevator delivery conveyor 68. The elevator conveyor or loader 12 travels vertically in front of the cassette 70 and inserts the books sequentially onto each tier of the cassette until the cassette is full. The cassette 70 then travels along rails 72 in front of the press 76 or 78 at which time the boom 74 pushes the load of books into the press openings. A loader or elevator conveyor 12 that may be used in the present invention is available from Technical Machine Products, 5500 Walworth Ave., Cleveland, Ohio under Model No. 20204/Loader and 20204/Unloader.

Unloader 14 is similar to loader 12. After the books have been pressed, the boom 74 pulls the load of books out of the press onto one of cassettes 70. The cassette 70 travels to a position in front of the unloader 12 where the elevator/conveyor pulls the books out of the cassette one at a time for discharge onto elevator discharge conveyor 80.

A book transfer conveyor 82 receives the book from the elevator discharge conveyor 80 and then discharges the book onto a book breakdown turntable 84 depicted in FIGS. 1 and 3. The book breakdown turntable 84 initially rotates the book 90° into a pickup position where the book is disassembled with a breakdown press plate handler 85. The handler 85 is movable between the pickup and deposit positions to sequentially engage the topmost exposed press plates 20 via a handler suction cup frame 87, described in more detail below, that delivers the transferred press plates onto a press plate conveyor 90. The thusly transferred press plate is conveyed via downstream press plate conveyors 90 to a plate cleaner 38 which subsequently transfers the clean press plate to the press plate indexing conveyor 40 which feeds the clean press plate back to the first clean room 24 in a new book building process in a continuous manner.

The press plate cleaner or wet buffer 38 is a conventional piece of equipment such as Model No. 8870-210.00 manufactured by Wasero Mashinenbau GmbH, D-4322 Sprockhovel 1, West Germany. The cleaner 38 generally comprises a washing section which sprays water onto the top and bottom of the press plate 20 as rotary abrasive brushes scrub both sides of the plate as it travels continuously on conveyor 90. The plate 20 then enters a rinsing section where water is again sprayed onto both top and bottom sides thereof above it is conveyed into a drying section where hot air is blown onto the plate through air knives to dry the plate before it exits the cleaner 38. Thereafter, the plate re-enters bottom copper placement room 24 on conveyor 40 through opening 34 in wall 36.

Once all the press plates 20 are removed from the cured book 16 in the manner set forth above, the book breakdown turntable 84, which is lowered elevationally coextensive with the upstream end of a carrier plate conveyor 92 located beneath the press plate conveyor 90, discharges the empty carrier plate 18 onto conveyor 92 for conveyance to a carrier plate indexing conveyor 94. The indexing conveyor 94 lowers, indexes the plate 90° and discharges it onto another carrier plate conveyor 96 maintaining the same plate orientation. This carrier plate conveyor 96 has a direction of travel perpendicular to the direction of conveyance of the press plate conveyors 90. This carrier plate conveyor 96 discharges the plate onto a second carrier plate indexing conveyor 98 which lowers and indexes the plate 90° in the direction of the layup station L while maintaining the same plate orientation. The plate 18 is then received on additional carrier plate conveyor 100 for discharge onto the carrier plate turntable 64 disposed beneath the layup line. The turntable 64 rotates the plate 90° so that it has the same angular orientation as the press plate/laminate package being formed above it. The carrier plate 18 is conveyed via carrier plate conveyors 60,62 for discharge onto the automatic laminate stacking table 59 in the manner described above.

It is preferred feature of this invention to operate the HVAC system (conventional) to establish an over-pressure in the top and bottom copper placement rooms 24,28 in relationship to the B-stage room 26, such over-pressure preferably being on the order of 0.10 inches of water. This over-pressure feature prevents pre-preg dust from entering either bottom or copper placement room 24 or 28 through openings 30,30' in walls 32,32', respectively.

Figure 5:
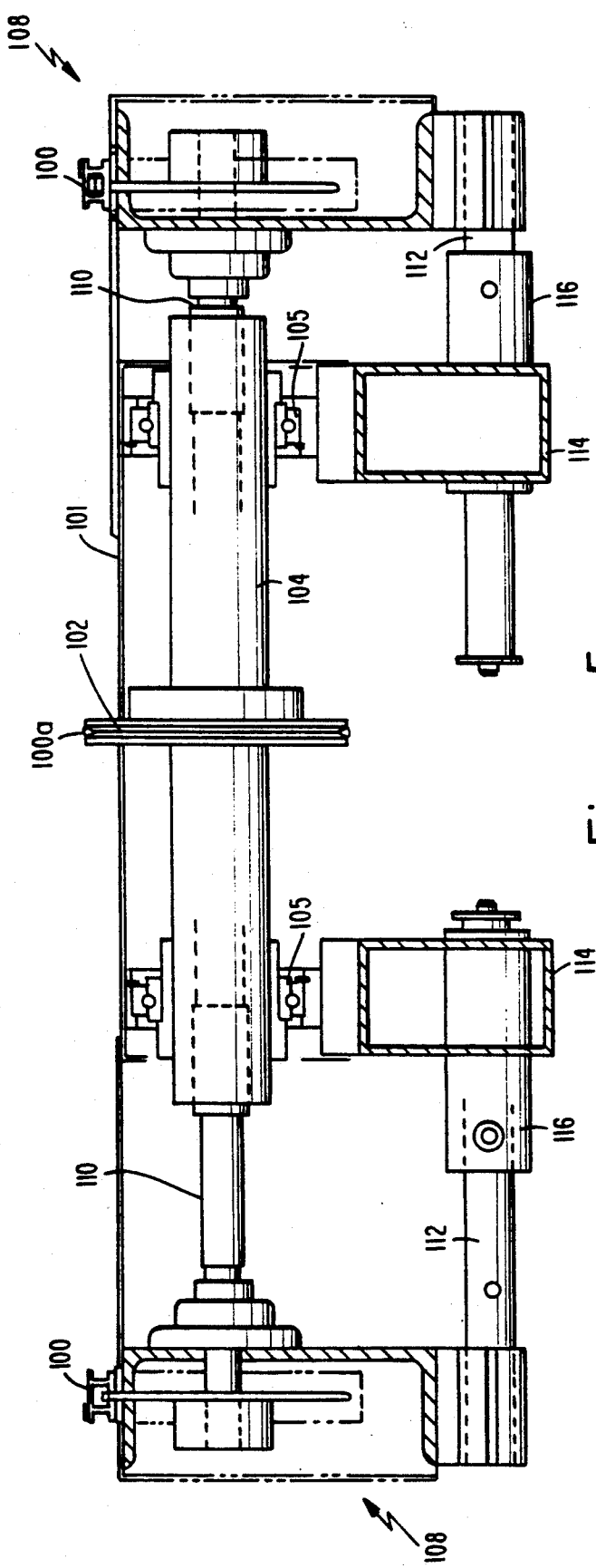
FIG. 5 is a sectional view of an exemplary press plate conveyor taken along the line 5—5 of FIGS. 2 or 4.
Figure 5A:
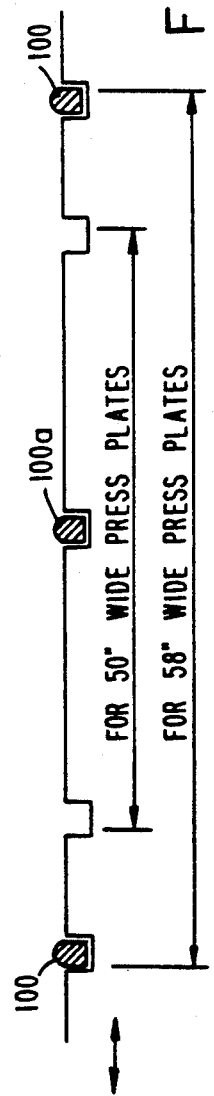
FIG. 5A is a conceptual sketch of a press plate conveyor top.

FIG. 5A is a conceptual sketch of a press plate conveyor top utilizing three belts 100 for carrying a press plate, one belt supporting each longitudinal side edge of press plate 20 and one center belt 100a supporting the middle underside of the press plate. With the three belts 100, surface contact between the belts and press plate is kept to a minimum. Optimally, a belt cleaner (not shown) may be installed on the underside of the conveyor for continuous cleaning of the belts. Preferably, the two edge belts 100 should contact the underside of the plate side no further into the plate than one inch from the edge. Such contact is highly preferred in an effort to further reduce the possibility of contamination from the belt transferring contaminant onto the plate and thus the laminate. The one inch edge of the laminate is trimmed off and scrapped and, therefore, it is not as critical if contamination is present in this one inch edge. The belt should preferably be easily removable for end of shift cleaning of the entire system as well as changeover for different plate sizes.

The belts 100 are preferably formed of a carbon-filled conductive material. The material is grounded to prevent a buildup of static charge on the press plates and thus attract any contaminant which may be present in the area. The center belt is preferably cleaned using a rotating brush which is continuously cleaned by a vacuum system.

FIG. 5 is an illustration of a preferred embodiment of a press plate conveyor (40,42,47,50,54) wherein center belt 100a is disposed within a roller 102 secured to a shaft 104 suitably mounted in bearings 105 for rotation in a known manner. The center belt 100a projects upwardly from a mirror finished shield 106. A pair of stationary side rails 108 respectively support side belts or guides 100 (preferably made of a frictionless material such as Teflon) in approximately the same elevational plane as belt 100a against which guides and belt the underside of press plate 20 is supported. A pair of coaxial slide shafts 110 project inwardly from side rails 108 into opposite open ends of shaft 104. Lower slide or guide shafts 112 also extend inwardly from side rails 108 to support a pair of lower longitudinally extending rails 114 supporting the center shaft 104 and thereby the center belt structure 100a. With this arrangement, it will be appreciated that the lateral spacing between side rails 108 may be adjusted to accommodate press plates 20 of different width, simply by manually moving the side rails 108 in relation to each other, causing sliding movement of shafts 110,112 within center shaft 104 or support collars 116 secured to lower support rails 114.

Figure 6A:
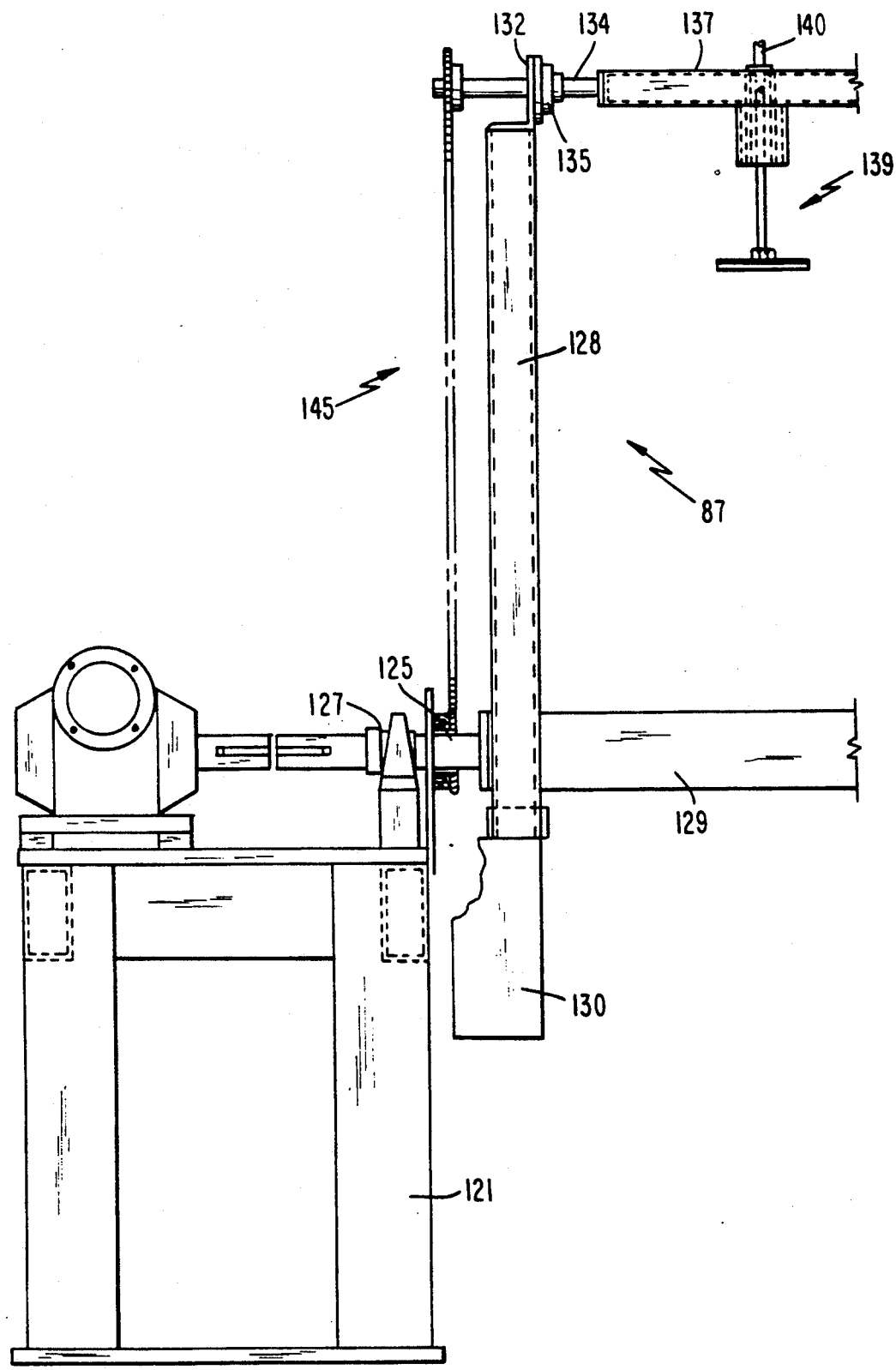
FIG. 6A is a sectional view taken along the line 6A—6A of FIG. 1 to depict the lefthand frame portion of a breakdown press plate handler.

As mentioned above, breakdown press plate handler 85 utilizes a suction cup frame 87 having three sets of pairs of suction cups 120 (connected to a vacuum system not shown) to lift the press plates 20 from breakdown table 84 for placement on upstreammost press plate conveyor 90 (FIG. 3). FIGS. 6-7 are illustrations of one embodiment of press plate handler 85. Therein, press plate handler 85 comprises a pair of upright supports 121 (FIG. 6) and 123 (FIG. 7) respectively located outwardly adjacent the sides of press plate conveyor 90 between the press plate conveyor and breakdown turntable 84. A support shaft 125 extends between supports 121,123 and is rotatably journalled to these supports as at 127. The suction cup frame 87 comprises a pair of vertical support members 128 keyed at their lower ends to an enlarged diameter portion 129 of the support shaft; counterweights 130 (FIGS. 6A and 7) are secured to the lower end of the lefthand support 128.

Figure 6B:
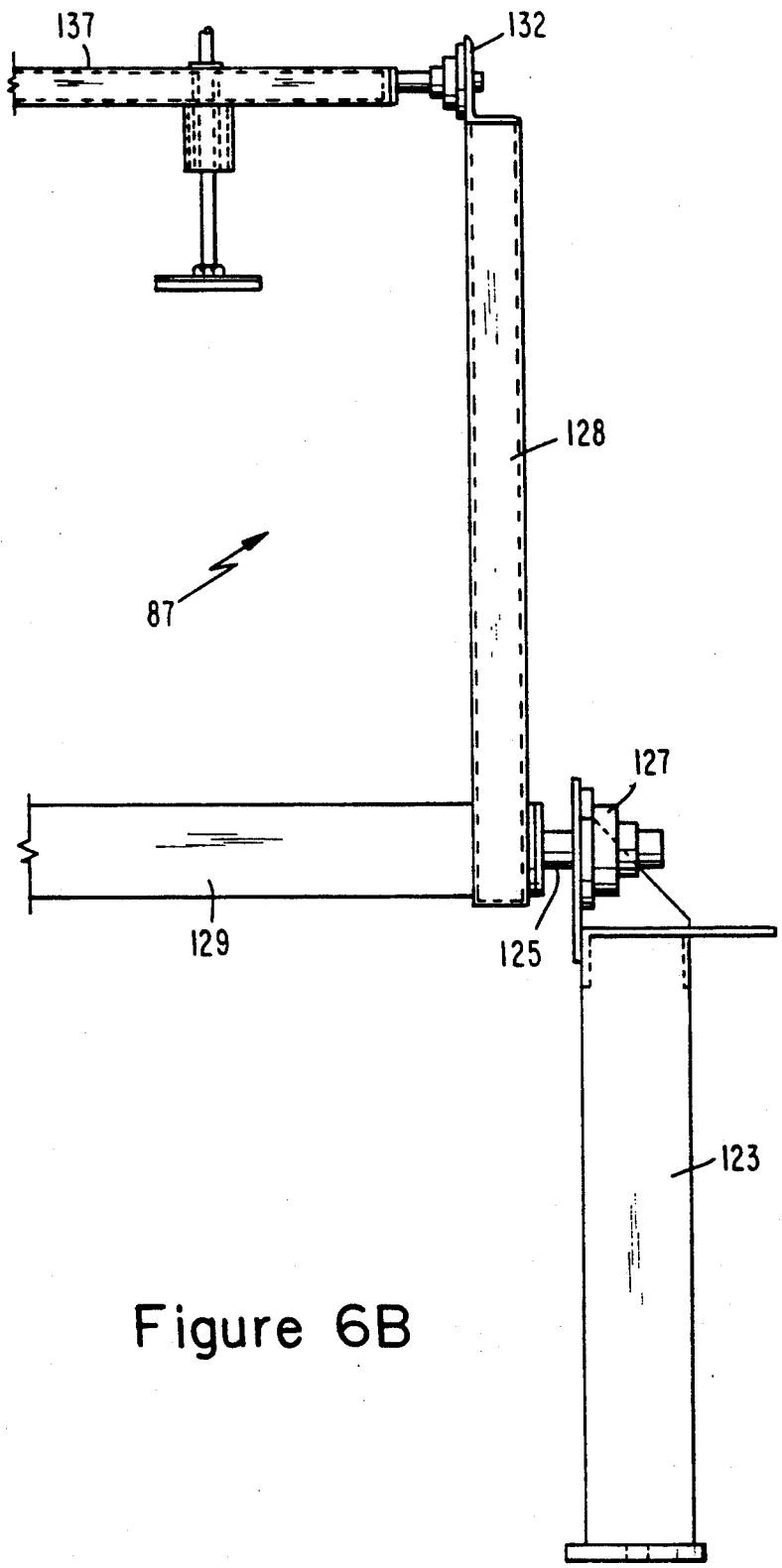
FIG. 6B is a sectional view taken along the line 6B—6B of FIG. 1 to depict the righthand frame portion of the breakdown press plate handler.
Figure 7:
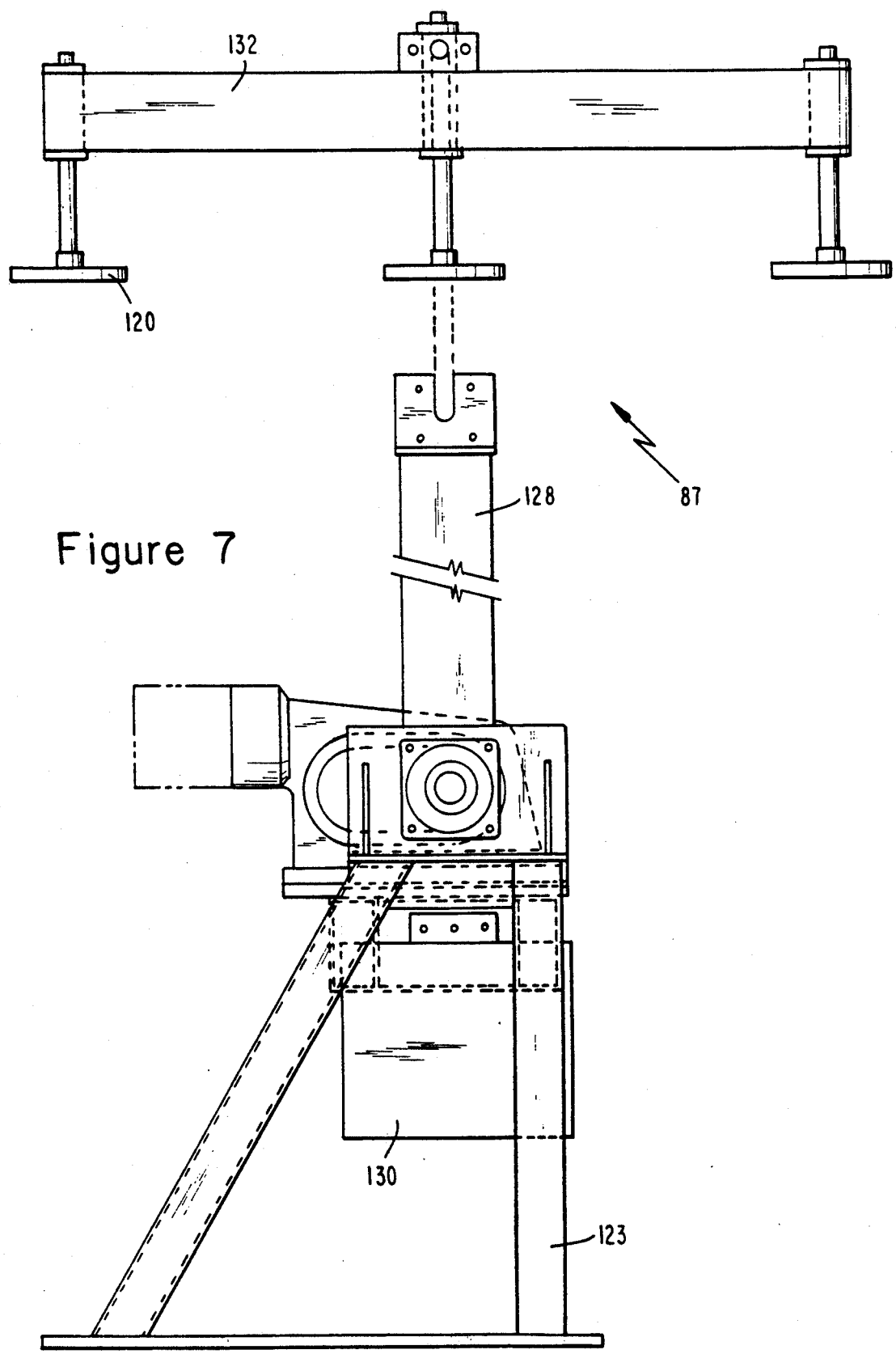
FIG. 7 is a right side elevational view of the handler of FIG. 6A and 6B.

A pair of brackets (e.g., L-brackets) 132 are respectively secured approximately at their mid-sections to the uppermost ends of vertical supports 128 as best depicted in FIGS. 6A, 6B and 7. Three support shafts 134 extend between and are rotatably secured to the brackets 132 with bearings 135. An outer shaft 137 is rotatably mounted to each shaft 134. A pair of press plate suction cup assemblies 139 are secured to the outer shaft 137 and are adapted to be connected to a source of suction with lines 140.

The suction cup assemblies 139 interconnected to their respective shafts 134 extend in a common plane which is maintained in a horizontal manner by means of chain drive mechanism 145. Chain drive mechanism 145 essentially acts as a timing chain enabling the frame defined by bracket rails 132 and shafts 134 to remain in a horizontal plane as uprights 128 rotate about center support shaft 129 from the three o'clock position of FIG. 3 counter-clockwise to the nine o'clock position to deposit an uppermost exposed press plate 20 on breakdown turntable 84 to upstreammost press plate conveyor 90.

It will be appreciated that as each press plate 20 is removed from turntable 84 with handler 85, the cured laminate is removed, either manually or by machine, to thereby expose the next press plate for removal with the handler in the breakdown procedure.

Figures 8, 9, 10:
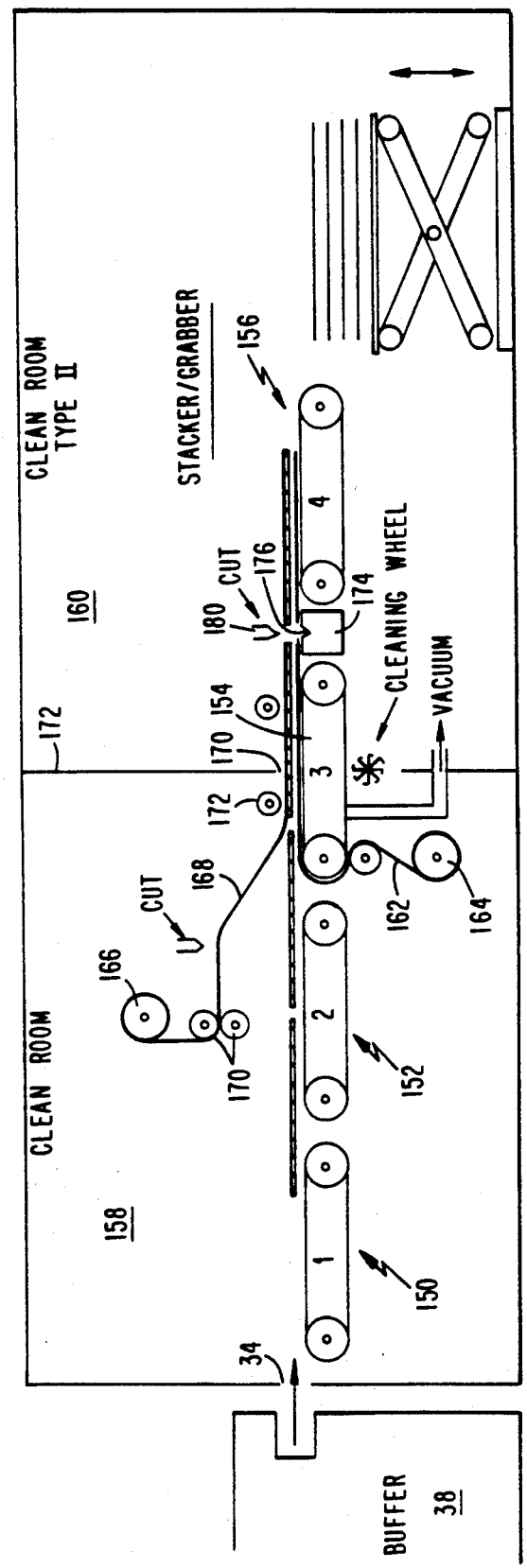
FIG. 8 is a cross-sectional view, partly schematic, of a buildup conveyor in accordance with a second embodiment of the present invention.
FIG. 9 is a enlarged detailed view of a clamping mechanism of the FIG. 8 embodiment.
FIG. 10 is a cross-sectional, partly schematic view, of a buildup conveyor in accordance with a third embodiment of the present invention.

FIGS. 8 and 9 are illustrations of a second embodiment of a layup line that may be used in place of clean rooms 24,26,28 in the FIG. 1 embodiment but otherwise in conjunction with the remainder of the FIG. 1 embodiment. Specifically, clean press plates (such as supplied by conveyor 40 from wet buffer 38) enter a clean room wherein a copper foil 130 is placed on an upward exposed surface of an air table 132 either manually or by means of an automatic dispenser (not shown). A clean press plate 20 is then placed on the upper surface of foil or copper sheet 130 and another clean foil or copper sheet 134 is then placed on the upper surface of press plate 20. A clamping mechanism 135 then pivots to clamp the edges of metal foils 130 and 134 to the edges of press plate 20. Air is then turned on and the air table 132 is lowered. The clamping mechanisms 135 which are on movable rails 137 supported on glide tracks 140 are then moved through a slot 30 (FIG. 2) into a pre-preg room where the copper, plate, copper sandwich is stacked on a carrier plate 18 and the clamp is released.

B-stage pre-preg is then placed on the top copper 134. The clamping mechanisms/slide rail assembly 135,137 return to the first clean room to pickup another copper, plate, copper sandwich. This process is repeated until the desired number of laminates are stacked on the carrier plate. Laminate stacking turntable 59 such as depicted in FIG. 2 may be utilized in this second embodiment.

The purpose of air table 132 is to maintain the bottom metal foil 130 in intimate contact with the press plate 20 to prevent foreign material from entering this interface. Obviously, this foil 130 becomes the top copper foil of a laminate and it is important that the upper surface of this foil 130 (i.e., in contact with the bottom surface of press plate 20) be kept free from foreign material. Air table 130, in accordance with one embodiment, has 403 32-inch holes uniformly distributed throughout its surface which enables approximately 1000 c.f.m. of air to pass through these holes. The air table may be made from half-inch Teflon and the aforementioned air flow is capable of floating the press plate/foil sandwich on the table. As depicted in FIG. 8, the air table may rest upon a base 142 extending between stationary longitudinally extending support frames 144. A mechanism for raising and lowering air table 132 is not shown but nonetheless obvious to one of ordinary skill in the art based upon the foregoing description.

The movable slide rails 137 support vertically spaced roller wheels 140a engaging top and bottom surfaces of stationary guide rails 140. These stationary guide rails 140 are suitably bolted to support frames 144 as at 146.

FIG. 10 is a schematic view of a third embodiment of this invention wherein four conveyors 150, 152, 154 and 156 are provided within a pair of clean rooms 158 and 160 downstream from buffer 38. In this embodiment, upstreammost conveyor 150 receives a clean press plate 20 from buffer 38 through an opening 34. Conveyor 152 serves as a staging conveyor to separate successive plate 20 a predetermined distance (e.g., one inch) from one another.

Conveyor 154 unwinds copper foil 162 from a roll 164 beneath the conveyor with the press plates 20 being fed from the second conveyor 152 onto the top of the copper foil 162 covering the upper run of conveyor 154. Another roll 166 of copper foil feeds a second layer of copper 168 onto the top of the press plate 20 on conveyor 154. The copper foil 168 is fed from between a pair of tensioning rollers 170 to a holddown 172 located above an upstream portion of conveyor 154. Thereby, as the press plate exits clean room 158 through opening 170 in wall 172, it is covered on both sides with top and bottom foils 168,162, respectively.

An air table 174 (having a structure similar to air table 132 in the FIG. 9 embodiment) is disposed in second clean room 160 between conveyors 154 and 156. In the center of the upper surface of air table 174 is provided a transversely extending notch 176 adapted to receive an overhead cutting member 180 which is arranged to cut through the strips 162,168 in the space between successively conveyed press plates 20. In this manner, a foil/press plate/foil sandwich similar to the sandwiches formed in the second embodiment is transferred onto a scissors lift 180 from conveyor 156. As each sandwich is transferred to the scissors lift, a sheet of pre-preg is manually or otherwise placed on the sandwich on the scissors lift to form a stack of laminates thereon. A movable clamping mechanism of the type disclosed in FIGS. 8 and 9 may be utilized to transfer the sandwich from downstream conveyor 156 to the scissors lift 180. When a book is completed on the scissors lift 180 it is transferred to a conveyor 66 (such as in the FIG. 1 embodiment) for ultimate conveyance to a press room P in the manner described above.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

We claim:

1. A system for manufacturing a copper clad laminate, the laminate having a B-stage substrate sheet with at least one first sheet of copper foil respectively adhered to at least one side of the B-stage, comprising:

(a) a layup station including at least two clean rooms communicating with each other through an opening provided in an adjoining common wall area; the first clean room adapted to contain copper foil and successively receive a plurality of press plates, the second clean room adapted to contain said B-stage sheets, a first layup region in the first clean room on which is received on said press plate with a sheeted layer of copper foil on at least one surface of the press plate; means for conveying the sandwich including the press plate and sheeted layer of copper foil from the first clean room, through the opening, into the second clean room having a second layup region on which a sheet of B-stage is placed into contact with the sandwich against the copper foil side thereof; a stacking station, downstream from the second clean room, for sequentially receiving the sandwiches to form a stacked book of said sandwiched laminates separated from each other with a press plate; said book including, and resting upon, a carrier plate delivered to said stacking station and on which said sandwiches are successively stacked;

(b) a pressing station to which at least one book is conveyed from the stacking station and wherein heat and pressure is applied to said book to melt and then harden the B-stage laminates to adhere the copper foils to their associated B-stage; and (c) a breakdown station to which said at least one book is delivered from the pressing station, said breakdown station including:
  i. breakdown press plate handler means movable between pickup and deposit positions for engaging an uppermost exposed press plate within the book and transferring it to the deposit position;
  ii. press plate conveyor means for receiving the transferred press plate at the deposit position and conveying same to the first cleaning room for recycling in the buildup of a subsequent book;
  iii. cleaning means, positioned within the press plate conveyor means, for cleaning the press plate before it is conveyed to the first clean room; and
  iv. means for conveying the carrier plate, following removal of all the press plates from the book via the handler means, to the stacking station for recycling.

2. The laminate handling system of claim 1, further including means for establishing an ambient atmospheric air pressure within the first clean room which is greater than the ambient atmospheric air pressure within the second clean room, to prevent the migration of B-stage dust or fibers from the second to the first clean room.

3. The laminate handling system of claim 1, further comprising a third clean room, positioned downstream form the second clean room and adapted to contain additional copper foil; means for positioning copper foil in the first room onto a press plate to enable B-stage to be deposited on said copper foil in the second room, and means for positioning said additional copper foil on the B-stage in the third clean room.

4. The laminate handling system of claim 3, further including means for establishing ambient atmospheric air pressures within the first and third cleaning rooms which pressures are greater than the ambient atmospheric air pressure within the second clean room, to prevent the migration of B-stage dust or fibers from the second to the first or third clean rooms.

5. The laminate handling system of claim 4, wherein separate conveyors are provided in each clean room to avoid transfer of B-stage dust or fibers, via the conveyors, into the first or third clean rooms.

6. The laminate handling system of claim 5, wherein said separate conveyors include a pair of thin belts positioned to contact and support only the longitudinally extending edges of the press plate, and a thin center belt adapted to contact the plate approximately along its lengthwise center line.

7. The laminate handling system of claim 6, further comprising means for cleaning the center belt after about each revolution.

8. The laminate handling system of claim 7, wherein said B-stage, copper foils, and resulting laminate are both handled and moved within the clean rooms without overhead handling equipment.

9. The laminate handling system of claim 1, further comprising first means for disposing said copper foil on a layup table in the first clean room, second means for positioning a press plate on said copper foil, and third means for positioning an additional copper foil on said press plate to form a metal sandwich, clamping means for clamping the copper foil and press plate together via clamping contact with the longitudinally extending edges of the metal sandwich; and means for conveying the metal sandwich and the clamping means into the second clean room onto which sandwich a sheet of B-stage is disposed against the surface of the top facing copper foil.

10. The laminate handling system of claim 9, wherein said layup table includes an air table adapted to receive the bottom copper foil, said air table including a plurality of air passageways substantially uniformly distributed in the upper surface of the air table, and means for supplying pressurized air through the passageway to establish a cushion of air between the table and lower surface of the bottom foil to prevent accumulation of B-stage dust or fibers on said lower surface.

11. The laminate handling system of claim 10, further comprising a pair of longitudinally extending stationary glide rails mounted along the sides of the air table, said clamping means including roller means engaging their respective glide rails in rolling contact for supporting the clamping means along the air table, for movement in the direction of conveyance of the metal sandwich, and clamping members connected to the roller means, each clamping member being movable between an unclamped position and a clamping position in clamping contact only with longitudinal edges of the sandwich extending laterally outward from the table.

12. The handling system of claim 1, wherein said breakdown station further includes a book breakdown turntable rotatable through 90° between first and second angular orientations, book transfer conveyor means for transferring the cured book of laminates from the pressing station to the breakdown turntable in the first angular orientation, said turntable in the second angular orientation being located in the pickup position of the breakdown press plate handler means to enable removal of the press plates from the book for discharge to the press plate conveyor means.

13. The handling system of claim 12, wherein the breakdown turntable is generally elevationally coextensive with the upstream end of the carrier plate conveyor means.

14. The handling system of claim 13, wherein the upstream end of the carrier plate conveyor means is located below the press plate conveyor means and further including carrier plate indexing conveyor means for receiving the carrier plate from the upstream end of the carrier plate conveyor means, means for lowering the carrier plate indexing conveyor means and indexing the plate 90° while maintaining the same plate orientation for travel in a direction of conveyance perpendicular to the direction of the press plate conveyor means, and a second carrier plate indexing conveyor, positioned downstream from the first indexing conveyor, for receiving the conveyor plate, lowering, and indexing the carrier plate through 90° for returning the carrier plate to the layup station, and a carrier plate turntable within the layup station for receiving the returning carrier plate and conveying same to the stacking station.

15. A method of manufacturing a copper clad laminate having a B-stage substrate sheet which is an epoxy-coated web of glass cloths with at least one first sheet of copper foil respectively adhered to at least one side of the B-stage, comprising the steps of providing a plurality of press plates and a supply of copper foil within a first clean room; providing a supply of B-stage sheets in a second clean room; positioning the copper foil on at least one surface of the press plate; conveying the sandwich including the press plate and copper foil from the first clean room into the second clean room; placing a sheet of B-stage into contact with the sandwich against the copper foil side thereof; delivering the resulting laminate to a stacking station; and repeating the foregoing steps to form a stacked book of said sandwiched laminates separated from each other with said press plates; wherein said clean rooms communicate with each other through an opening through which the laminates are transferred from the first to second clean rooms, and comprising the further step of maintaining an over-pressure within the first clean room, relative to the second clean room, to prevent the migration of B-stage dust of fibers from the second to the first room.

16. The method of claim 15, comprising the further steps of delivering the book from the stacking station to a pressing station, and applying heat and pressure to the book to melt and thereby harden the B-stage laminate to adhere the copper foils to their associated B-stage.

17. The method of claim 16, comprising the further steps of delivering said at least one book from the pressing station to a breakdown station, breaking down the book at the breakdown station by successively stripping uppermost exposed press plates and laminates from the book, sequentially delivering the stripped press plates from the breakdown station to a pressed plate conveyor means for transferring the press plates back to the first clean room for recycling and use in the buildup of subsequent books, and cleaning the press plate surfaces immediately prior to conveying means to the first clean room, and conveying the carrier plate to the stacking station following removal of all press plates from the book.

18. The method of claim 17, comprising the further steps of providing additional copper foil in a third clean room, positioning copper foil in the first clean room onto a press plate, positioning B-stage onto the copper foil in the second clean room, and positioning said additional copper foil on the B-stage in the third clean room, and maintaining an over-pressure of ambient air in the third clean room relative to the second clean room.

19. The method of claim 17, comprising the further steps of disposing copper foil on a layup table in the first clean room, positioning a press plate on said copper foil and disposing additional copper foil on the press plate to form a metal sandwich in the first clean room, clamping lengthwise edges of the sandwich together and conveying the sandwich from the first to the second clean room, unclamping the sandwich and positioning a sheet of B-stage on the sandwich and then conveying same to the stacking station.

20. The method of claim 19, comprising the further step of supplying pressurized air against the bottom surface of the bottom copper foil during conveyance from the first to the second clean room to prevent accumulation of B-stage dust or fibers on the bottom surface.

21. A system for manufacturing a copper clad laminate, the laminate having a B-stage substrate sheet with at least one first sheet of copper foil respectively adhered to at least one side of the B-stage, comprising a layup station including at least two clean rooms communicating with each other through an opening provided in an adjoining common wall area; the first clean room adapted to contain copper foil and successively receive a plurality of press plates, the second clean room adapted to contain said B-stage sheets, a first layup region in the first clean room on which is received one said press plate with a sheeted layer of copper foil on at least one surface of the press plate; means for conveying the sandwich including the press plate and sheeted layer of copper foil from the first clean room, through the opening, into the second clean room having a second layup region on which a sheet of B-stage is placed into contact with the sandwich against the copper foil side thereof; a stacking station, downstream from the second clean room, for sequentially receiving the sandwiches to form a stacked book of said sandwiched laminates separated from each other with a press plate; said book including, and resting upon, a carrier plate delivered to said stacking station and on which said sandwiches are successively stacked.

22. The laminate handling system of claim 21, further including means for establishing an ambient atmospheric air pressure within the first clean room which is greater than the ambient atmospheric air pressure within the second clean room, to prevent the migration of B-stage dust or fibers from the second to the first clean room.

23. The laminate handling system of claim 21, further comprising a third clean room, positioned downstream from the second clean room and adapted to contain additional copper foil; means for positioning copper foil in the first room onto a press plate to enable B-stage to be deposited on said copper foil in the second room, and means for positioning said additional copper foil on the B-stage in the third clean room.

24. The laminate handling system of claim 23, further including means for establishing ambient atmospheric air pressure within the first and third cleaning rooms which pressures are greater than the ambient atmospheric air pressure within the second clean room, to prevent the migration of B-stage dust or fibers from the second to the first or third clean rooms.

25. The laminate handling system of claim 24, wherein separate conveyors are provided in each clean room to avoid transfer of B-stage dust or fibers, via the conveyors, into the first or third clean rooms.

* * * * *